US010201076B2

(12) United States Patent
Liu et al.

(10) Patent No.: US 10,201,076 B2
(45) Date of Patent: Feb. 5, 2019

(54) COUPLER FOR PROXIMITY WIRELESS COMMUNICATION

(71) Applicant: KABUSHIKI KAISHA TOSHIBA, Tokyo (JP)

(72) Inventors: Jia Liu, Kawasaki Kanagawa (JP); Motochika Okano, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 156 days.

(21) Appl. No.: 15/439,803

(22) Filed: Feb. 22, 2017

(65) Prior Publication Data

US 2018/0049313 A1 Feb. 15, 2018

Related U.S. Application Data

(60) Provisional application No. 62/374,566, filed on Aug. 12, 2016.

(51) Int. Cl.
| | |
|---|---|
| *H01P 5/02* | (2006.01) |
| *H05K 1/02* | (2006.01) |
| *G06K 7/00* | (2006.01) |
| *H01Q 1/24* | (2006.01) |
| *H01Q 9/40* | (2006.01) |
| *H01Q 5/50* | (2015.01) |
| *H05K 1/18* | (2006.01) |

(Continued)

(52) U.S. Cl.
CPC ............ *H05K 1/0237* (2013.01); *G06K 7/00* (2013.01); *H01Q 1/243* (2013.01); *H01Q 5/50* (2015.01); *H01Q 9/40* (2013.01); *H01Q 1/38* (2013.01); *H01Q 13/10* (2013.01); *H01Q 21/0006* (2013.01); *H01Q 21/08* (2013.01); *H04W 4/80* (2018.02); *H05K 2201/1003* (2013.01); *H05K 2201/1006* (2013.01); *H05K 2201/10015* (2013.01); *H05K 2201/10098* (2013.01); *H05K 2201/10636* (2013.01)

(58) Field of Classification Search
CPC .................................... H01P 5/02; H01K 1/18
USPC ....................................................... 333/24 R
See application file for complete search history.

(56) References Cited

U.S. PATENT DOCUMENTS

| | | | |
|---|---|---|---|
| 5,532,658 A * | 7/1996 | Tonegawa | H05K 1/0239 257/693 |
| 6,642,904 B2 | 11/2003 | Yokoshima et al. | |
| 2013/0120950 A1* | 5/2013 | Tomaki | H01P 1/20345 361/782 |

FOREIGN PATENT DOCUMENTS

| | | | |
|---|---|---|---|
| JP | 2002204118 A | 7/2002 | |
| JP | 2010275718 A | 12/2010 | |

(Continued)

*Primary Examiner* — Dean Takaoka
(74) *Attorney, Agent, or Firm* — Patterson & Sheridan, LLP

(57) ABSTRACT

A coupler for proximity wireless communication primarily based on an electric induction field generated therein, includes a substrate, a ground layer formed on a first region of the substrate and surrounding a second region of the substrate on three sides of the second region, a fourth side of the second region being defined by an edge of the substrate, and a coupling element electrically isolated from the ground layer and formed on the second region of the substrate. The coupling element includes a first portion that extends adjacent to and along the edge of the substrate and a second portion that is electrically connected to the first portion, extends inwardly from the edge of the substrate, and includes an inductor.

20 Claims, 10 Drawing Sheets

(51) Int. Cl.
*H04W 4/80* (2018.01)
*H01Q 1/38* (2006.01)
*H01Q 13/10* (2006.01)
*H01Q 21/00* (2006.01)
*H01Q 21/08* (2006.01)

(56) References Cited

FOREIGN PATENT DOCUMENTS

| | | | |
|---|---|---|---|
| JP | 2011098533 A | 5/2011 |
| JP | 5561615 B2 | 7/2014 |
| JP | 2014127752 A | 7/2014 |

\* cited by examiner

US 10,201,076 B2

COUPLER FOR PROXIMITY WIRELESS COMMUNICATION

CROSS-REFERENCE TO RELATED APPLICATIONS

This application is based upon and claims the benefit of priority from U.S. Provisional Patent Application No. 62/374,566, filed on Aug. 12, 2016, the entire contents of which are incorporated herein by reference.

FIELD

Embodiments described herein relate generally to a coupler and an electronic device.

BACKGROUND

A coupler used for proximity wireless communication with another coupler is known.

DETAILED DESCRIPTION

Figure 1:
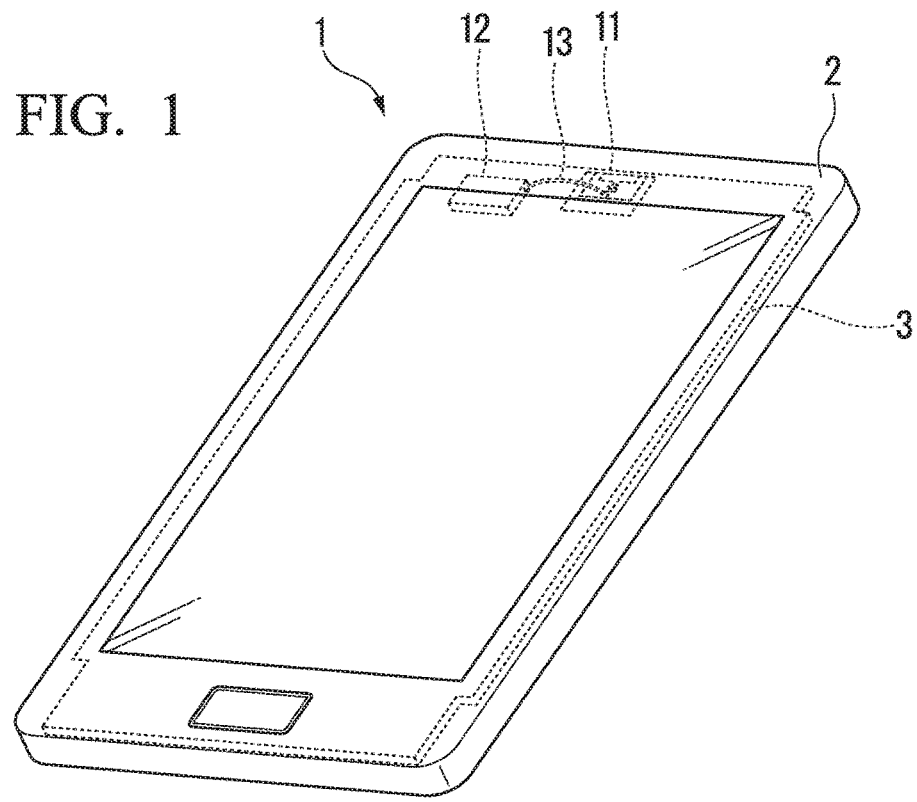
FIG. 1 is a perspective view of an electronic device according to a first embodiment.

A coupler for proximity wireless communication primarily based on an electric induction field generated therein, includes a substrate, a ground layer formed on a first region of the substrate and surrounding a second region of the substrate on three sides of the second region, a fourth side of the second region being defined by an edge of the substrate, and a coupling element electrically isolated from the ground layer and formed on the second region of the substrate. The coupling element includes a first portion that extends adjacent to and along the edge of the substrate and a second portion that is electrically connected to the first portion, extends inwardly from the edge of the substrate, and includes an inductor.

Hereinafter, a coupler and an electronic device according to embodiments will be described with reference to the drawings. In the following description, configurations having the same or similar functions are denoted by the same reference numerals. In some cases, repeated descriptions of these configurations may be omitted.

First Embodiment

A first embodiment will be described with reference to FIGS. 1 to 4. FIG. 1 is a perspective view of an electronic device 1 according to the first embodiment.

As shown in FIG. 1, the electronic device 1 including a coupler 11 is a smartphone. However, the electronic device 1 is not limited to the smartphone. The electronic device 1 may be various electronic devices (e.g., a wireless device, or an information processing device) including a portable computer, a tablet terminal, a USB device, an SD card and the like.

As shown in FIG. 1, the electronic device 1 includes a housing 2 and a circuit board 3 in the housing 2. The circuit board 3 includes the coupler 11 and a communication module (i.e., wireless module) 12.

The coupler 11 transmits and receives information by being electromagnetically coupled with a coupler of a device (hereinafter referred to as an external device) that is external to the electronic device 1. The details of the coupler 11 will be described below.

The communication module 12 communicates with the external device via the coupler 11. For example, the communication module 12 includes a conversion circuit (e.g., a radio circuit) that converts data to be transmitted via the coupler 11 into high-frequency signals. The communication module 12 is electrically connected to the coupler 11 via a coaxial cable 13, a patterned wiring layer, or the like. The communication module 12 transmits information to the external device via the coupler 11, by supplying the high-frequency signals to the coupler 11. In addition, the communication module 12 receives information from the external device via the coupler 11 based on the electromagnetic coupling of the coupler 11.

The configuration of the electronic device 1 described above is the same in the second and third embodiments and the like.

Figure 2:
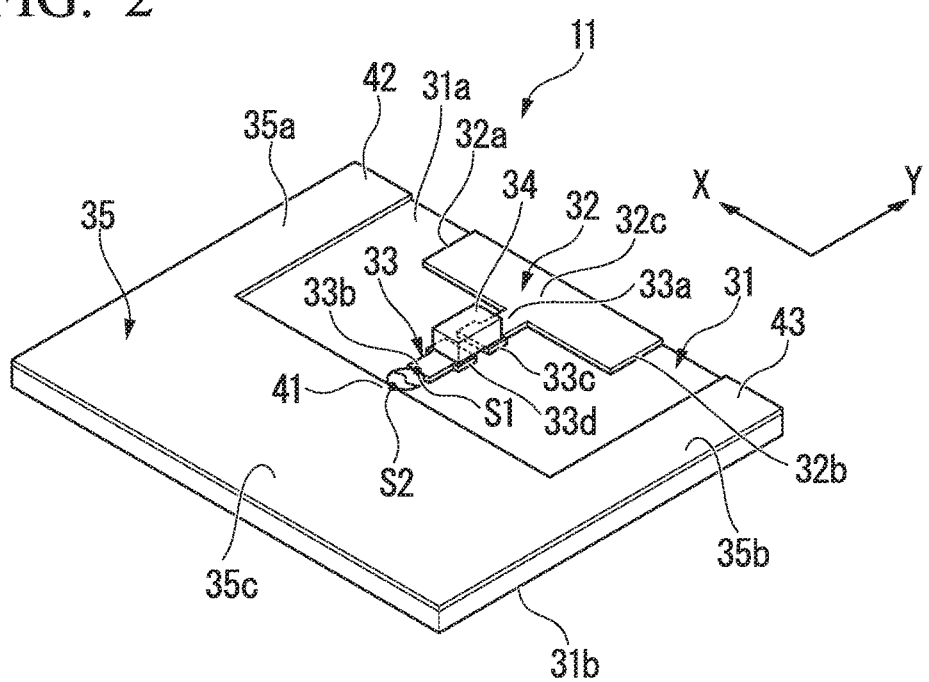
FIG. 2 is a perspective view of a coupler according to the first embodiment.

FIG. 2 is a perspective view of the coupler 11 according to the first embodiment.

The coupler 11 according to the first embodiment performs proximity wireless communication by being electromagnetically coupled with another coupler (i.e., a coupler of the external device). The proximity wireless communication is communication performed between devices that are close to each other. "electromagnetic coupling" used in the present disclosure means a communication system using an electric induction field in which an electric field is dominant (e.g., a communication system using electric charge accumulated in a conductor), rather than a coupling in which a magnetic field is dominant and which is utilized by NFC (Near Field Communication). For example, the coupler 11 of the present embodiment performs communication using longitudinal electromagnetic waves.

The coupler 11 of the present embodiment is, for example, a planar coupler conforming to TransferJet®. TransferJet® is a proximity wireless communication system using UWB (Ultra Wide Band). In a communication system conforming to TransferJet®, when two devices (e.g., couplers of the two devices) are within a communication distance (e.g., 3 cm), communication is performed between the two devices. The coupler 11 of the present embodiment is, for example, a TransferJet® coupler compatible with 4.5 GHz band.

As shown in FIG. 2, the coupler 11 of the present embodiment includes a board 31, a coupling element 32, a feeding element 33, an inductor component 34, and a ground 35.

The board 31 is a base on which elements of the coupler 11 are formed and is a dielectric board. The board 31 may be a part of the circuit board 3 of the electronic device 1 or may be provided separately from the circuit board 3 of the electronic device 1. The board 31 has a flat plate shape, and includes a first surface 31a and a second surface 31b opposite to the first surface 31a.

The coupling element (i.e., a coupling electrode, or a coupling portion) 32 is a portion in which electric charges used for electromagnetic coupling are mainly accumulated. In other words, the coupling element 32 is a portion that generates the longitudinal electromagnetic waves used for the communication. The coupling element 32 is an electromagnetically-coupling element. The coupling element 32 is, for example, a metal pattern (i.e., a conductive pattern) formed on a surface of the board 31. The coupling element 32 is to be coupled with a coupling element of another coupler (i.e., a coupler of the external device). The coupling element 32 is, for example, formed on the first surface 31a of the circuit board 3. In the present embodiment, the coupling element 32 has a rectangular planar shape. The shape of the coupling element 32, however, is not limited thereto. The shape of the coupling element 32 may be a linear shape, a circular shape, another polygonal shape, or other shapes. For example, the shape of the coupling element 32 may be a looped shape (see FIG. 6) or an inverted-F-shape (see FIG. 7). "Circular shape" used in the present disclosure may be an elliptical shape or the like, without being limited to a perfect circle.

The coupling element 32 includes a first open end 32a, a second open end 32b, and an intermediate portion 32c. The first open end 32a is, for example, one end of the coupling element 32 in a longitudinal direction of the coupling element 32. The second open end 32b is the other end of the coupling element 32 in the longitudinal direction of the coupling element 32. The second open end 32b is located on the opposite side of the first open end 32a in the coupling element 32. The first open end 32a and the second open end 32b are not connected to other conductors. The intermediate portion 32c is an intermediate portion (i.e., a central portion) between the first open end 32a and the second open end 32b. That is, the intermediate portion 32c is located at substantially the same distance from the first open end 32a and the second open end 32b.

The feeding element 33 is a feeding line that transmits the high-frequency signals supplied to a feed point S1, to the coupling element 32. In addition, the feeding element 33 is also a feeding line which transmits high-frequency signals received by the coupling element 32 from the external device, to the feed point S1. The feeding element 33 is a metal pattern (i.e., a conductive pattern) provided on the surface of the board 31. The feeding element 33 is formed between the feed point S1 and the coupling element 32. The feeding element 33 linearly extends between the feed point S1 and the coupling element 32, and electrically connects the feed point S1 and the coupling element 32. Here, "feed point S1" used in the present disclosure means a positive feed point (i.e., a feeder, a signal supplier, or a signal line connector) to which the high-frequency signals are supplied from the communication module 12. For example, if the communication module 12 and the coupler 11 are connected to each other by the coaxial cable 13 (see FIG. 1), the feed point S1 is a portion to which a signal line 13a (see FIG. 4) of the coaxial cable 13 is electrically connected. In other words, the feed point is a point from which the coupling element extends, and branches off from the other circuit components of the coupler 11. Further, "feed point S1" used in the present embodiment is a feed point for the coupling element 32 and the inductor component 34. Therefore, as will be described below with reference to FIG. 4, if the coupler 11 includes a high-frequency filter 53 (also referred to as a "high pass filter"), a connection portion between the high-frequency filter 53 and the feeding element 33 is the "feed point S1" as used in the present embodiment.

The feeding element 33 includes a first end 33a connected to the intermediate portion 32c of the coupling element 32, and a second end 33b connected to the feed point S1. The feeding element 33 of the present embodiment includes a first pad 33c and a second pad 33d between the first end 33a and the second end 33b. The first pad 33c and the second pad 33d are disposed apart from each other. No wiring pattern is formed between the first pad 33c and the second pad 33d. That is, the feeding element 33 includes the first end 33a and the second end 33b that are separated from each other.

The inductor component 34 is formed between the feed point S1 and the coupling element 32. The inductor component 34 is disposed over the first pad 33c and the second pad 33d of the feeding element 33, and electrically connects the first pad 33c and the second pad 33d. The inductor component 34 is, for example, a chip component including a coil (i.e., a coil element). The inductor component 34 is, for example, an inductor having several [nH]. The inductor component 34 functions as an inductor provided in the feeding element 33.

Figure 3:
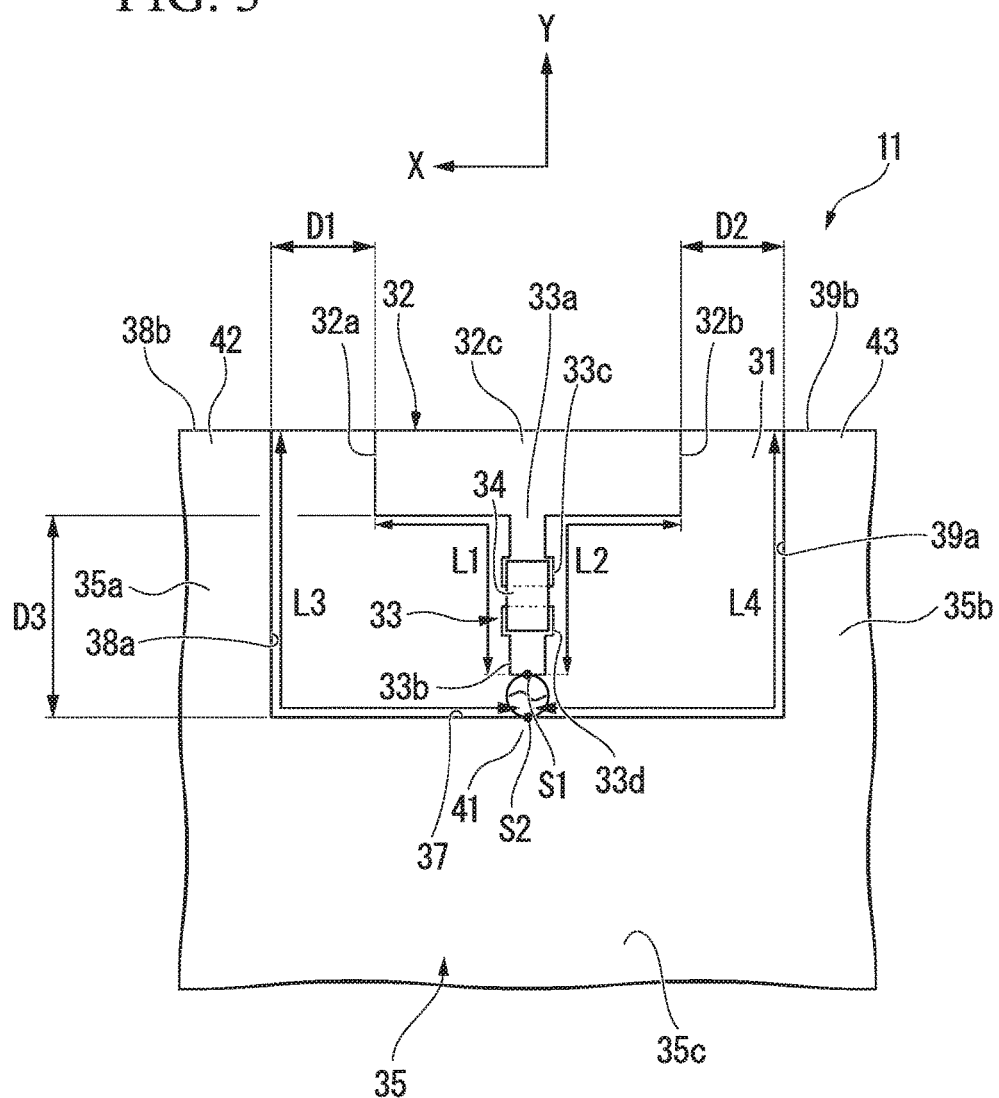
FIG. 3 is a plan view of the coupler according to the first embodiment.

FIG. 3 is a plan view of the coupler 11 according to the present embodiment.

As shown in FIG. 3, in the present embodiment, assuming that the center frequency of the electromagnetic waves to be transmitted and received by the coupling element 32 is $\lambda$, a physical length between the feed point S1 and the first open end 32a of the coupling element 32 is shorter than $\lambda/4$. Similarly, a physical length between the feed point S1 and the second open end 32b of the coupling element 32 is shorter than $\lambda/4$. "Physical length" means a physical length (i.e., the actual length) of the electrical path between the two points. The physical length between the feed point S1 and the first open end 32a of the coupling element 32 is a sum of the physical length between the feed point S1 and the intermediate portion 32c of the coupling element 32, and the physical length between the intermediate portion 32c and the first open end 32a of the coupling element 32. Similarly, the physical length between the feed point S1 and the second open end 32b of the coupling element 32 is a sum of the physical length between the feed point S1 and the intermediate portion 32c of the coupling element 32, and the physical length between the intermediate portion 32c and the second open end 32b of the coupling element 32.

Here, the inductor component 34 of the present embodiment adjusts an electrical length L1 between the feed point S1 and the first open end 32a of the coupling element 32 to substantially $\lambda/4$. That is, the inductor component 34 makes the electrical length L1 between the feed point S1 and the first open end 32a of the coupling element 32 be substantially $\lambda/4$. In other words, the electrical length L1 defined between the feed point S1 and the first open end 32a of the coupling element 32 via the inductor component 34 is substantially $\lambda/4$. Similarly, the inductor component 34 adjusts an electrical length L2 between the feed point S1 and the second open end 32b of the coupling element 32 to substantially $\lambda/4$. Here, "electrical length" refers to the electrical length of the electrical path between the two points (e.g., a length considering the delay time of a signal, the dielectric constant, etc.). The electrical length is generally a length of an electrical conductor in terms of the phase shift introduced by transmission over that conductor at some frequency. The electrical length L1 between the feed point S1 and the first open end 32a of the coupling element 32 is a sum of the electrical length between the feed point S1 and the intermediate portion 32c of the coupling element 32, and the electrical length between the intermediate portion 32c and the first open end 32a of the coupling element 32. Similarly, the electrical length L2 between the feed point S1 and the second open end 32b of the coupling element 32 is a sum of the electrical length between the feed point S1 and the intermediate portion 32c of the coupling element 32, and the electrical length between the intermediate portion 32c and the second open end 32b of the coupling element 32.

In other words, while maintaining the electrical length L1 between the feed point S1 and the first open end 32a of the coupling element 32 at substantially λ/4, the physical length between the feed point S1 and the first open end 32a of the coupling element 32 becomes smaller than λ/4 by disposing the inductor component 34. Similarly, in the present embodiment, while maintaining the electrical length L2 between the feed point S1 and the second open end 32b of the coupling element 32 at substantially λ/4, the physical length between the feed point S1 and the second open end 32b of the coupling element 32 becomes smaller than λ/4 by disposing the inductor component 34.

The configuration of the present embodiment is not limited to the above example. From a general point of view, the physical length between the feed point S1 and the first open end 32a of the coupling element 32 is shorter than n×λ/4 (n is an arbitrary odd number, especially, 1 or 5 are preferable). Similarly, the physical length between the feed point S1 and the second open end 32b of the coupling element 32 is shorter than n×λ/4. The inductor component 34 adjusts the electrical length L1 between the feed point S1 and the first open end 32a of the coupling element 32 to n×λ/4. Similarly, the inductor component 34 adjusts the electrical length L2 between the feed point S1 and the second open end 32b of the coupling element 32 to n×λ/4.

The ground 35 is a metal conductor, and is, for example, a metal pattern or a metal plate formed on the surface of the board 31. For example, the ground 35 is a ground plane on the surface of the board 31. The ground 35 is located in part opposite to the coupler 11 and the feeding element 33 with respect to the feed point S1, and functions as a ground for the coupler 11. In the present embodiment, the ground 35 is formed in a region specially separated from the coupling element 32 in the first surface 31a of the board 31. Alternatively, the ground 35 may be formed in a region of the second surface 31b of the board 31, which does not face the coupling element 32 in the thickness direction of the board 31. The ground 35 is connected to a ground side feed point S2. Here, "ground side feed point S2" in the present disclosure refers to a feed point (i.e., a ground connection portion, or a ground line connection portion) paired with the feed point (i.e., the positive feed point) S1. The ground side feed point S2 is a portion to which a ground interconnect is connected (e.g., physically connected). For example, if the communication module 12 and the coupler 11 are connected to each other via the coaxial cable 13, a ground portion 13b (see FIG. 4) of the coaxial cable 13 is physically and electrically connected to the ground side feed point S2.

The ground 35 according to the present embodiment includes a first ground portion (i.e., a first portion, a first region, or a first ground plane portion) 35a, a second ground portion (i.e., a second portion, a second region, or a second ground plane portion) 35b, and a third ground portion (i.e., a third portion, a third region, or a third ground plane portion) 35c. Each of the first ground portion 35a, the second ground portion 35b and the third ground portion 35c is formed in a planar shape along the surface of the board 31.

As shown in FIG. 3, the first ground portion 35a and the second ground portion 35b are dividedly disposed in both sides of the coupling element 32 in a direction intersecting with (e.g., substantially orthogonal to) a direction from the feed point S1 to the coupling element 32. For example, the first ground portion 35a and the second ground portion 35b are dividedly disposed in both sides of the coupling element 32 in the longitudinal direction of the coupling element 32. That is, the coupling element 32 is located between the first ground portion 35a and the second ground portion 35b in the longitudinal direction of the coupling element 32. Hereinafter, the direction intersecting with (e.g., substantially orthogonal to) the direction from the feed point S1 to the coupling element 32 is referred to as a "first direction X". Further, the direction from the feed point S1 to the coupling element 32 is referred to as a "second direction Y".

The first ground portion 35a faces the first open end 32a of the coupling element 32 in the first direction X. That is, at least a part of the first ground portion 35a and the first open end 32 are in a line that extends in the first direction X. The first ground portion 35a is separated from the first open end 32a of the coupling element 32 in the first direction X. Similarly, the second ground portion 35b faces the second open end 32b of the coupling element 32 in the first direction X. That is, at least a part of the second ground portion 35b and the first open end 32 are in a line that extends in the first direction X. The second ground portion 35b is separated from the second open end 32b of the coupling element 32 in the first direction X.

The third ground portion 35c is disposed opposite to the coupling element 32 with respect to the inductor component 34. The third ground portion 35c is connected to the ground side feed point S2. The third ground portion 35c is formed integrally with at least one of the first ground portion 35a and the second ground portion 35b. In the present embodiment, the first ground portion 35a, the second ground portion 35b, and the third ground portion 35c are integrally formed in a planar shape and are electrically connected to one another. That is, the ground 35 includes a single piece ground including the first ground portion 35a, the second ground portion 35b, and the third ground portion 35c.

In other words, the third ground portion 35c extends in the first direction X in a region opposite to the coupling element 32 with respect to the inductor component 34. The third ground portion 35c, for example, extends substantially in parallel with the coupling element 32. The first ground portion 35a and the second ground portion 35b extends from the third ground portion 35c in the second direction Y. That is, the first ground portion 35a and the second ground portion 35b are dividedly disposed in both sides of the coupling element 32, by protruding from the third ground portion 35c in the second direction Y. In the present embodiment, the feeding element 33 and the inductor component 34 are disposed in a region surrounded by the coupling element 32, the first ground portion 35a, the second ground portion 35b, and the third ground portion 35c.

As shown in FIG. 3, in the present embodiment, a distance (e.g., the shortest distance) D1 between the first ground portion 35a and the coupling element 32 is shorter than a distance (e.g., shortest distance) D3 between the third ground portion 35c and the coupling element 32. Similarly, a distance (e.g., the shortest distance) D2 between the second ground portion 35b and the coupling element 32 is shorter than the distance (e.g., the shortest distance) D3 between the third ground portion 35c and the coupling element 32.

The ground 35 includes a first end 41 that is connected to the ground side feed point S2. Further, "connected" used in the present disclosure includes a case of being connected through a via or the like, in addition to the case of being directly connected. In other words, the first end 41 is closer to the feed point S1 than the first ground portion 35a. In the present embodiment, the first end 41 is an end of the third ground portion 35c.

In the present embodiment, the third ground 35c includes a side 37 that extends in the first direction X. The side 37 is closer to the feed point S1 than the central portion of the third ground portion 35c. The side 37 includes the first end 41.

On the other hand, the first ground portion 35a includes a second end 42 located opposite to the first end 41 with respect to the central portion of the first ground portion 35a. For example, the second end 42 is located opposite to the first end 41 with respect to the central portion of the first ground portion 35a in the second direction Y. In other words, the second end 42 is, for example, an end of the first ground portion 35a in the second direction Y. The second end 42, for example, is aligned with the coupling element 32 in the first direction X.

In the present embodiment, the first ground portion 35a includes a first side 38a and a second side 38b. The first side 38a is connected to the side 37 of the third ground portion 35c. The first side 38a extends from the side 37 of the third ground portion 35c in the second direction Y. The second side 38b is connected to the first side 38a. The second side 38b extends from the first side 38a in the first direction X. The second side 38b includes the second end 42.

In the present embodiment, an electrical length L3 between the first end 41 and the second end 42 is substantially λ/4. The "electrical length L3 between the first end 41 and the second end 42," for example, is an electrical length of the electrical path along the outer periphery of the first ground portion 35a and the third ground portion 35c. For example, the electrical length L3 is an electrical length of the electrical path along the side 37 of the third ground portion 35c and the first side 38a of the first ground portion 35a.

From a general point of view, the electrical length between the first end 41 and the second end 42 is m×λ/4 (m is an arbitrary odd number). "m" may be the same as or different from the aforementioned number "n." Further, the electrical length L3 between the first end 41 and the second end 42 is not limited to the aforementioned example.

Similarly, the second ground portion 35b includes a third end 43 located opposite to the first end 41 with respect to the central portion of the second ground portion 35b. For example, the third end 43 is located opposite to the first end 41 with respect to the central portion of the second ground portion 35b in the second direction Y. The third end 43 is, for example, an end of the second ground portion 35b in the second direction Y. The third end 43 is, for example, aligned with the coupling element 32 in the first direction X.

In the present embodiment, the second ground portion 35b includes a first side 39a and a second side 39b. The first side 39a is connected to the side 37 of the third ground portion 35c. The first side 39a extends from the side 37 of the third ground portion 35c in the second direction Y. The second side 39b is connected to the first side 39a. The second side 39b extends from the first side 39a in the first direction X. The second side 39b includes the third end 43.

In the present embodiment, an electrical length L4 between the first end 41 and the third end 43 is substantially λ/4. "Electrical length L4 between the first end 41 and the third end 43" is, for example, an electrical length of the electrical path along the outer shape of the second ground portion 35b and the third ground portion 35c. For example, the electrical length L4 is an electrical length of the electrical path along the side 37 of the third ground portion 35c and the first side 39a of the second ground portion 35b.

From a general point of view, the electrical length L4 between the first end 41 and the third end 43 is m×λ/4 (m is an arbitrary odd number). Further, the electrical length L4 between the first end 41 and the third end 43 is not limited to the above example.

Figure 4:
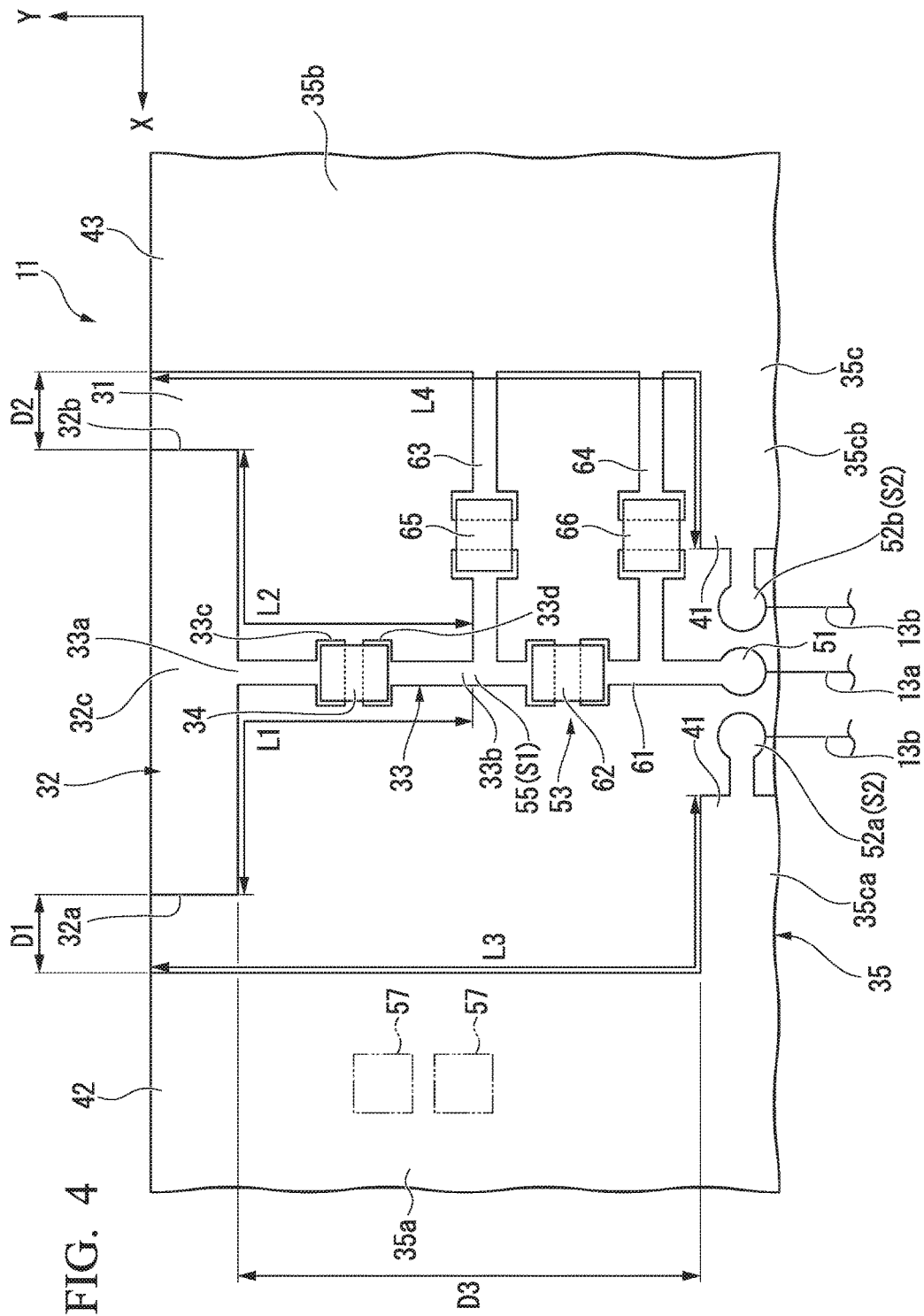
FIG. 4 is an enlarged plan view of a part of the coupler according to the first embodiment.

FIG. 4 is an enlarged plan view of a part of the coupler 11 according to the present embodiment.

As shown in FIG. 4, the coupler 11 of the present embodiment includes a signal terminal 51, ground terminals 52a and 52b, and a high-frequency filter 53, in addition to the aforementioned configuration. The third ground portion 35c is divided into a first portion 35ca formed integrally with the first ground portion 35a, and a second portion 35cb formed integrally with the second ground portion 35b.

The signal terminal 51 is a terminal to which the high-frequency signals are input from the communication module 12. The signal terminal 51 is also a terminal which outputs the high-frequency signals to the communication module 12. In the present embodiment, when the communication module 12 and the coupler 11 are connected to each other via the coaxial cable 13, the signal line 13a of the coaxial cable 13 is connected to the signal terminal 51.

On the other hand, the ground terminals 52a and 52b are terminals to which the ground portion of the communication module 12 is electrically connected. For example, if the communication module 12 and the coupler 11 are connected to each other by the coaxial cable 13, the ground portion 13b (i.e., ground interconnect) of the coaxial cable 13 is connected to each of the ground terminals 52a and 52b. In the present embodiment, each of the ground terminals 52a and 52b is the ground side feed point S2. One ground terminal 52a is connected to the first portion 35ca of the third ground portion 35c. The other ground terminal 52b is connected to the second portion 35cb of the third ground portion 35c.

The high-frequency filter 53 is disposed between the signal terminal 51 and the feeding element 33. The high-frequency filter 53 is, for example, a π-type filter, and includes a first line 61, an inductor component 62, a second line 63, a third line 64, a first capacitor component 65, and a second capacitor component 66.

The first line 61 extends between the signal terminal 51 and the feeding element 33. The first line 61 electrically connects the signal terminal 51 and the feeding element 33.

The high-frequency filter 53 filters high-frequency signals directed from the signal terminal 51 to the feed point S1 to remove noise. Further, the high-frequency filter 53 filters high-frequency signals directed from the feed point S1 to the signal terminal 51 to remove noise. As described above, in the present embodiment, a connection portion 55 between the high-frequency filter 53 and the feeding element 33 functions as the feed point S1 to the coupler 11. Therefore, in the present embodiment, it can be said that the physical length between the connection portion 55 and the first open end 32a of the coupling element 32 is shorter than λ/4. Similarly, it can be said that the physical length between the connection portion 55 and the second open end 32b of the coupling element 32 is shorter than λ/4. Further, the inductor component 34 adjusts the electrical length L1 between the connection portion 55 and the first open end 32a of the coupling element 32 to substantially λ/4. Similarly, the inductor component 34 adjusts the electrical length L2 between the connection portion 55 and the second open end 32b of the coupling element 32 to substantially λ/4.

The configuration of the high-frequency filter 53 is not limited to the above example. The high-frequency filter 53 may be, for example, an L-shape filter or a T-shape filter, or may have other configurations. In addition, in order to construct a high-frequency filter, omission, replacement, a change in arrangement, or the like of components may also be performed.

The coupler 11 of the present embodiment may include the electronic components 57 mounted on the board 31. For example, when the board 31 is viewed in a plan view, the electronic components 57 are disposed in a region of the board 31 which overlaps the first ground portion 35a. For example, the electronic components 57 are mounted on the surfaces opposite to the surface on which the first ground portion 35a is formed, among the first surface 31a and the second surface 31b of the board 31. In the present embodiment, the comports 57 are disposed on the second surface 31b of the board 31 and overlap at least in part the first ground portion 35a in the thickness direction of the board 31.

According to the coupler 11 and the electronic device 1 having such a configuration, it is possible to adjust the electrical lengths L1 and L2 between the feed point S1 and the open ends 32a and 32b of the coupling element 32, by the inductor component 34. For example, even if the physical length between the feed point S1 and the open ends 32a and 32b of the coupling element 32 is shorter than λ/4, it is possible to adjust the electrical lengths L1 and L2 between the feed point S1 and the open ends 32a and 32b of the coupling element 32 to substantially λ/4. As a result, it is possible to reduce the sizes of the coupler 11 and the electronic device 1 while maintaining the communication performance of the coupler 11.

In the present embodiment, the ground 35 includes the first ground portion 35a and the second ground portion 35b that are dividedly disposed in both sides of the coupling element 32. According to such a configuration, it is possible to suppress the influence of unnecessary radiation from the outside by the first ground portion 35a and the second ground portion 35b. As a result, the communication performance of the coupler 11 can be enhanced. According to the configuration of the present embodiment, since the size of the coupling element 32 can be reduced by the inductor component 34 as described above, even when the first ground portion 35a and the second ground portion 35b are dividedly disposed in both sides of the coupling element 32, the coupler 11 is unlikely to increase in size. Therefore, it is possible to improve communication performance and to provide the coupler 11 and the electronic device 1 which are suitable for miniaturization.

In the present embodiment, the ground 35 includes the first end 41 connected to the ground side feed point S2. The first ground portion 35a includes the second end 42 located opposite to the first end 41 with respect to the central portion of the first ground portion 35a. The electrical length L3 between the first end 41 and the second end 42 is substantially λ/4. According to such a configuration, the characteristics of the coupler 11 can be improved by the ground 35. Therefore, the communication performance of the coupler 11 can be further improved.

Several modified examples of the first embodiment will be described below.

Figure 5:
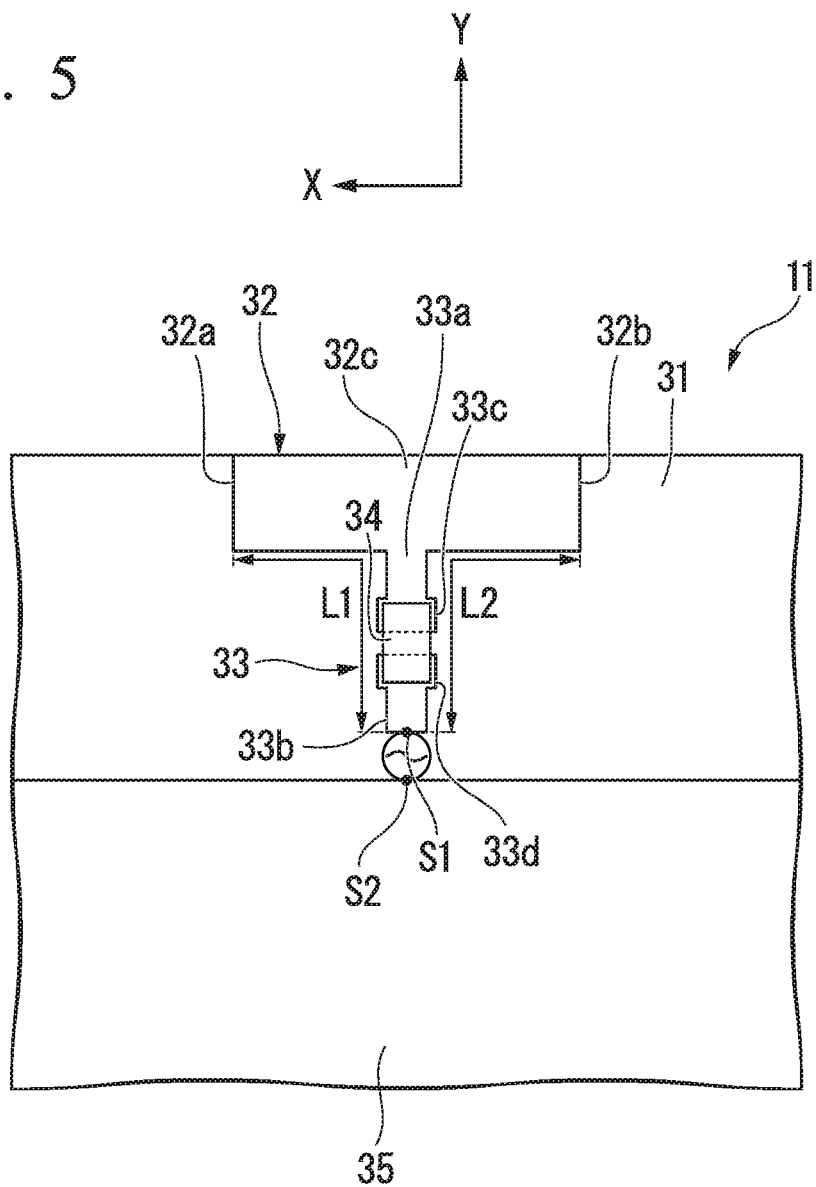
FIG. 5 is a plan view of a coupler according to a first modified example of the first embodiment.

FIG. 5 is a plan view of the coupler 11 according to a first modified example of the first embodiment. In the first modified example, the ground 35 does not include the first ground portion 35a and the second ground portion 35b. Even with such a configuration, by disposing the inductor component 34, it is possible to reduce the size of the coupling element 32. Therefore, it is possible to reduce the sizes of the coupler 11 and the electronic device 1.

Figure 6:
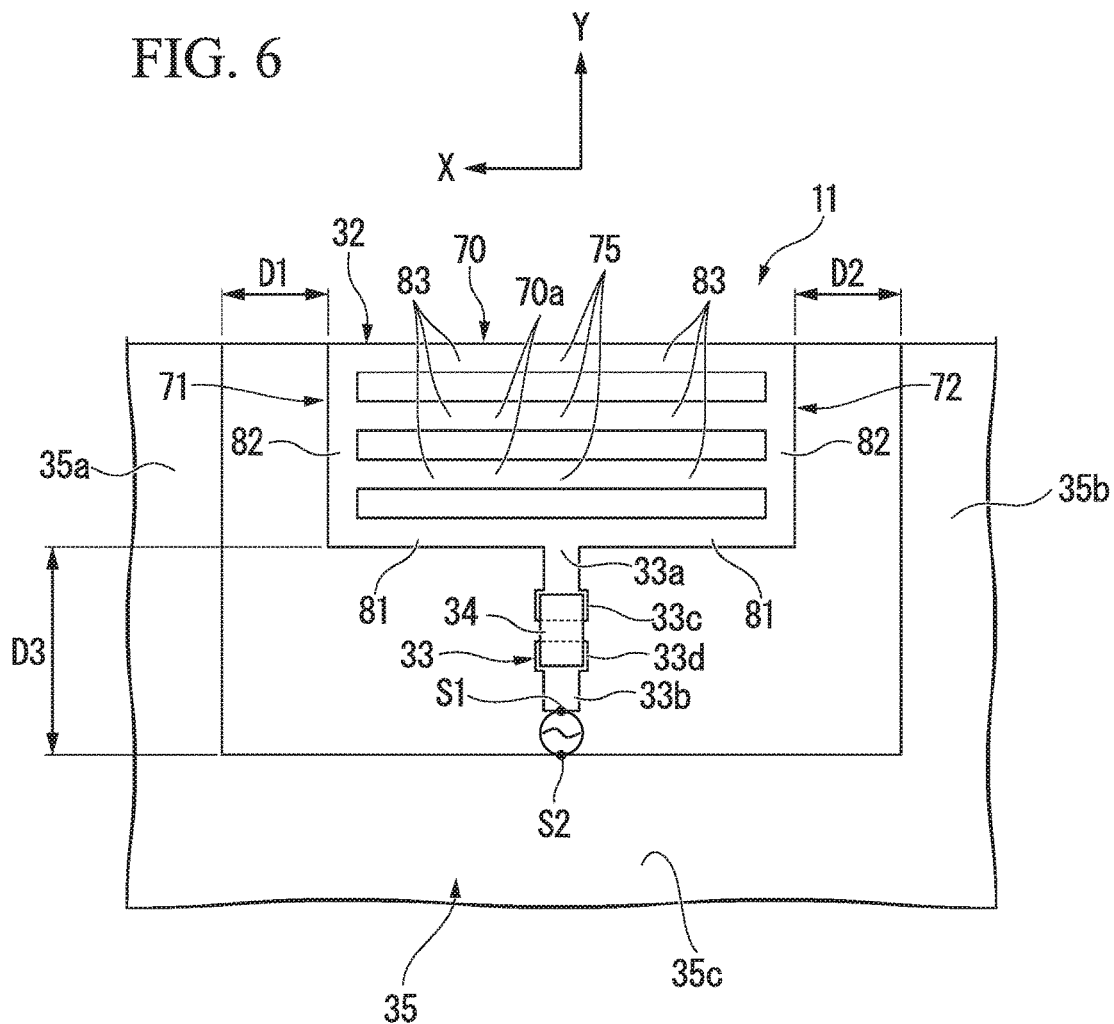
FIG. 6 is a plan view of a coupler according to a second modified example of the first embodiment.

FIG. 6 is a plan view of the coupler 11 according to a second modified example of the first embodiment. The coupling element 32 of the coupler 11 according to the second modified example has a looped shape, similarly to the second embodiment to be described below. In other words, the coupling element 32 includes a plurality (here three) slits. The structure and operation of the coupler 11 of the second modified example will be described in detail in the description of the second embodiment to be described below.

Figure 7:
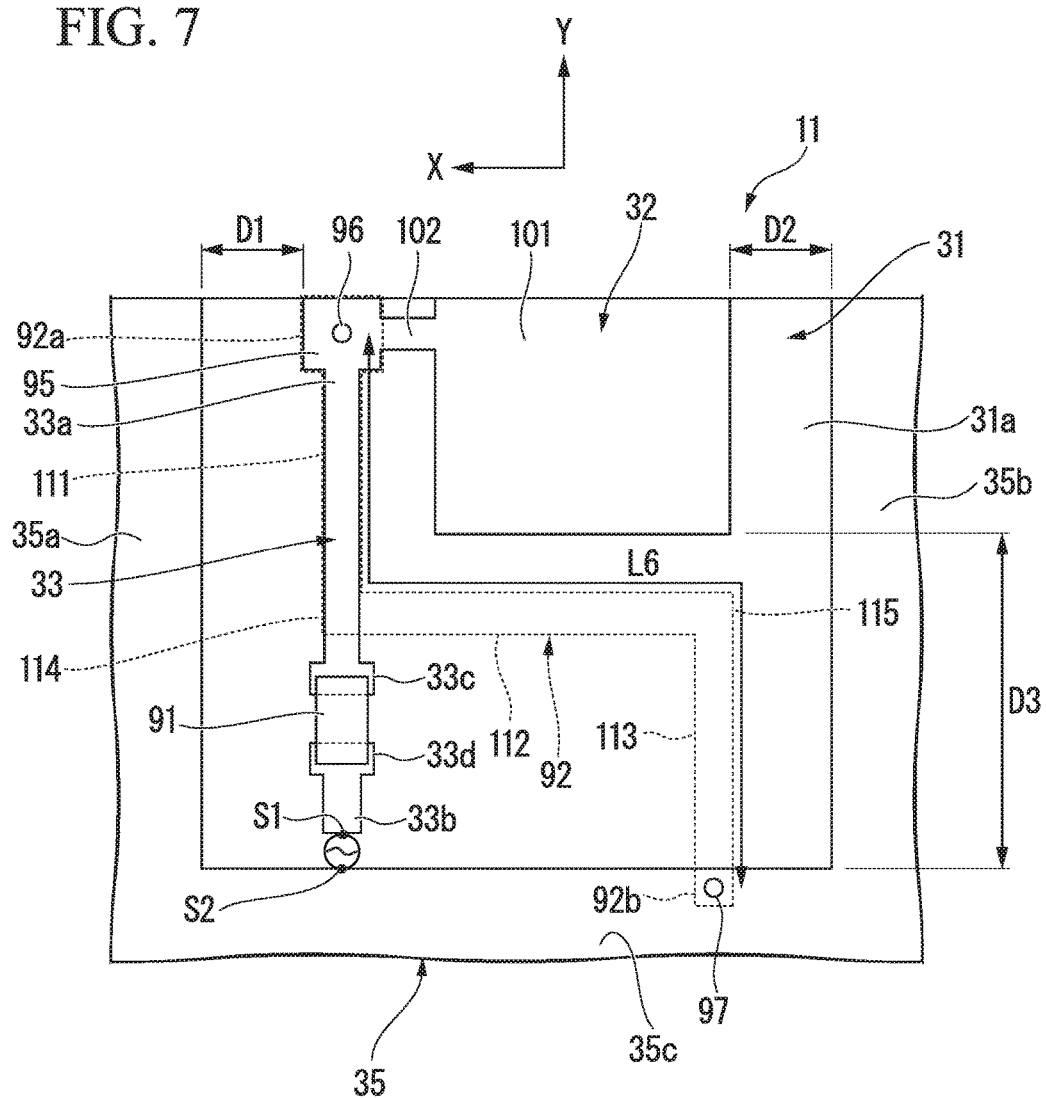
FIG. 7 is a plan view of a coupler according to a third modified example of the first embodiment.

FIG. 7 is a plan view of the coupler 11 according to a third modified example of the first embodiment. The coupling element 32 of the coupler 11 according to the third modified example is formed in an inverted-F-shape, similarly to the third embodiment to be described below. The structure and operation of the coupler 11 of the third modified example will be described in detail in the description of the third embodiment to be described below.

Second Embodiment

The coupler 11 according to a seconds embodiment is different from that of the first embodiment in that the coupling element 32 has a looped shape and the like. The configurations other than those described below are the same as those of the first embodiment.

Figure 8:
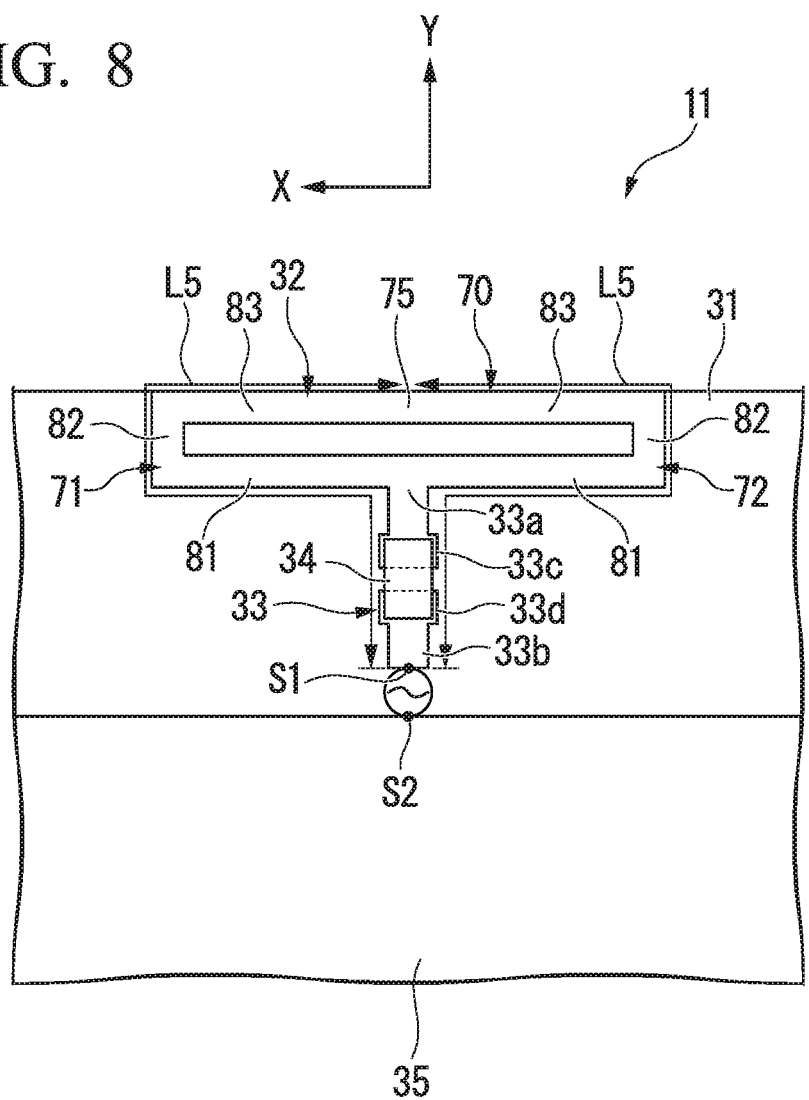
FIG. 8 is a plan view of a coupler according to a second embodiment.

FIG. 8 is a plan view of the coupler 11 according to the second embodiment.

As shown in FIG. 8, the coupler 11 according to the second embodiment includes the board 31, the coupling element 32, the feeding element 33, the inductor component 34, and the ground 35. In the present embodiment, the ground 35 does not include the first ground portion 35a and the second ground portion 35b. Further, the inductor component 34 may be omitted. However, when the inductor component 34 is provided, the size of the coupling element 32 can be reduced.

The coupling element 32 of the present embodiment includes a looped portion 70 substantially symmetrical with respect to an extending axis of the feeing element 33. For example, the looped portion 70 includes a first element 71 and a second element 72. The first element 71 and the second element 72 extend toward the sides opposite to each other from the feeding element 33, and are folded back to connect the tip parts thereof to each other. Thus, the coupling element 32 of the present embodiment is formed in a looped shape. In other words, a slit is formed in the coupling element 32.

Specifically, each of the first element 71 and the second element 72 includes a first portion 81, a second portion 82, and a third portion 83. The first portion 81 of the first element 71 and the first portion 81 of the second element 72 extend away from the feeding element 33. The first portion 81 of the first element 71 and the first portion 81 of the second element 72 extend in the first direction X. The second portion 82 of the first element 71 and the second portion 82 of the second element 72 extend in the second direction Y from the end of the first portion 81. The third portion 83 of the first element 71 and the third portion 83 of the second element 72 extend toward each other from the end of the second portion 82. The third portion 83 of the first element 71 and the third portion 83 of the second element 72 extend in the first direction X. For example, the third portion 83 extends substantially in parallel with the first portion 81. The third portion 83 of the first element 71 and the third portion 83 of the second element 72 are connected to each other at their tip parts.

In the present embodiment, for example, an electrical length L5 from the feed point S1 to a connection portion 75 between the first element 71 and the second element 72 is adjusted to λ/4 by the inductor component 34. "Electrical length L5 from the feed point S1 to the connection portion 75 between the first element 71 and the second element 72" is, for example, an electrical length leading from the feed point S1 to the connection portion 75 through the feeding element 33, and the first portion 81, the second portion 82 and the third portion 83 of the first element 71 of the coupling element 32. Further, "electrical length L5 from the feed point S1 to the connection portion 75 between the first element 71 and the second element 72" is, for example, an electrical length leading from the feed point S1 to the connection portion 75 through the feeding element 33, and the first portion 81, the second portion 82, and the third portion 83 of the second element 72 of the coupling element 32. Here, even when the inductor component 34 is omitted, the electrical length L5 from the feed point S1 to the connection portion 75 between the first element 71 and the second element 72 may be set to substantially λ/4. Further, in general terms, the electrical length L5 between the feed point S1 and the connection portion 75 is substantially an arbitrary odd number of times λ/4.

Next, the operation of the coupler 11 of the present embodiment will be described.

Figure 9:
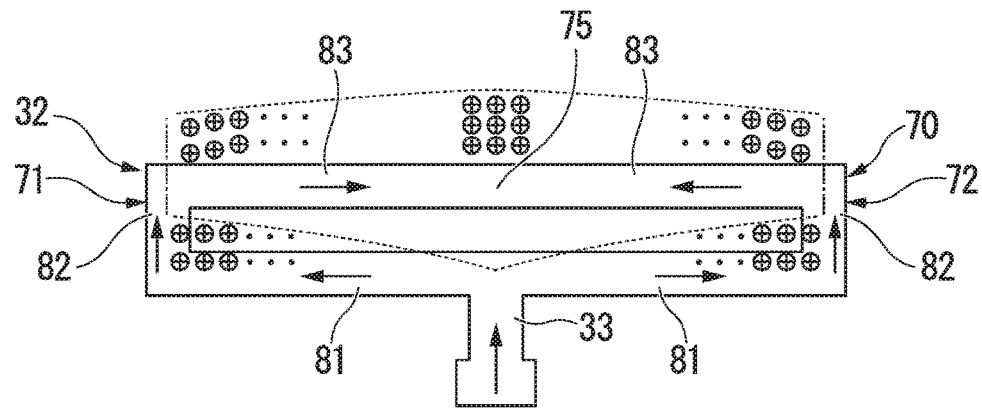
FIG. 9 schematically illustrates an electric charge distribution in the coupler according to the second embodiment.

FIG. 9 schematically shows an electric charge distribution of the coupler 11 according to the present embodiment. The arrow in FIG. 9 shows an example of a flow direction of current in the coupler 11.

As shown in FIG. 9, larger amounts of electric charges are accumulated in portions of the first portion 81 of the first element 71 and the first portion 81 of the second element 72 that are farther from the feeding element 33. Similarly, larger amounts of electric charges are accumulated in portions of the third portion 83 of the first element 71 and the third portion 83 of the second element 72 that are closer to the connection portion 75 between the first element 71 and the second element 72.

Here, in each of the first element 71 and the second element 72, the electric charges accumulated in the first portion 81 and the electric charges accumulated in the third portion 83 are electric charges that have the same polarity (i.e., both are positive/negative). Therefore, in the coupling element 32 of the present embodiment, in each of the first element 71 and the second element 72, the first portion 81 and the third portion 83 strengthen the electric field with each other. Therefore, the communication performance of the coupler 11 can be improved.

Further, in the present embodiment, the electric charges accumulated in the third portion 83 of the first element 71 and the electric charges accumulated in the third portion 83 of the second element 72 are electric charges that have the same polarity (i.e., both are positive/negative). Further, in the present embodiment, the third portion 83 of the first element 71 and the third portion 83 of the second element 72 are connected to each other. Therefore, the third portion 83 of the first element 71 and the third portion 83 of the second element 72 strengthen the electric field with each other. Therefore, the communication performance of the coupler 11 can be further improved.

In the present embodiment, the third portion 83 of the first element 71 and the third portion 83 of the second element 72 are connected to each other. As a result, it is possible to further reduce the sizes of the coupler 11 and the electronic device 1.

In the present embodiment, the coupler 11 is formed in a looped shape. When the coupler 11 is formed in a looped shape, the radiation generated in the upper and lower spaces of the coupler 11 is more likely to be strengthened. Therefore, it is possible to provide the coupler 11 which exhibits strong directivity in a direction perpendicular to the board 31.

Modified Example of Second Embodiment

Figure 10:
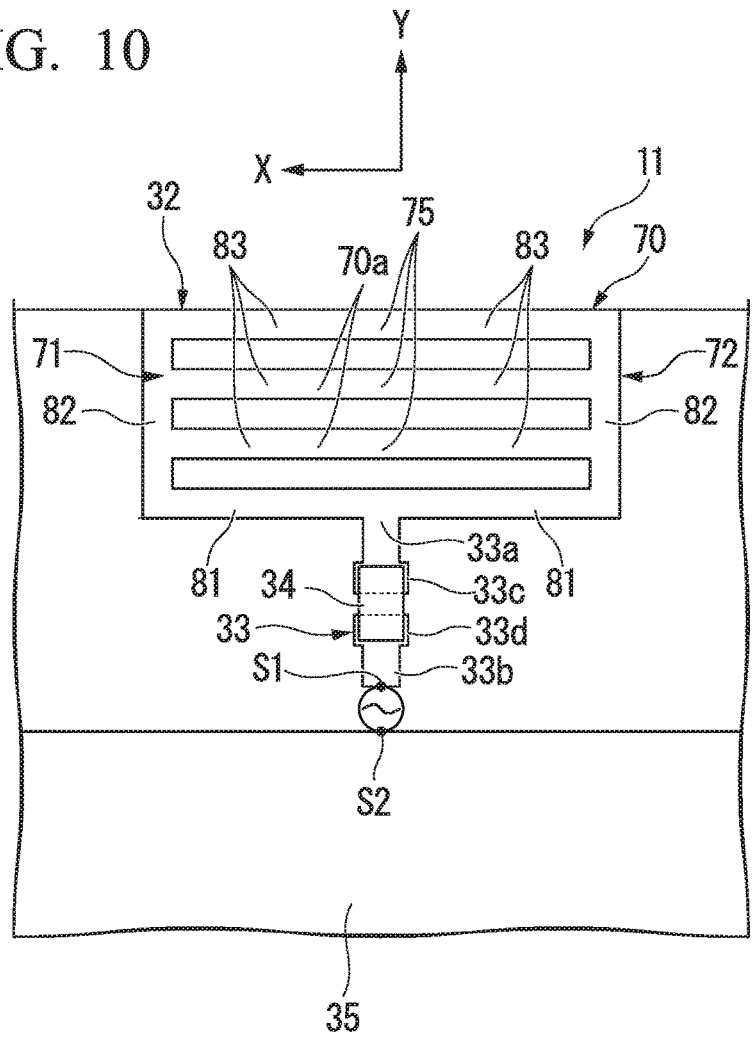
FIG. 10 is a plan view of a coupler according to a modified example of the second embodiment.

FIG. 10 is a plan view showing the coupler 11 according to a modified example of the second embodiment.

As shown in FIG. 10, the coupling element 32 of the present modified example includes the first element 71 and the second element 72 as in the second embodiment. The first element 71 and the second element 72 extend toward the sides opposite to each other from the feeding element 33, and are folded back to connect the tip parts thereof to each other. In the present modified example, each of the first element 71 and the second element 72 includes a plurality of third portions 83 (e.g., linear elements) which diverge from each other and extend substantially in parallel. The plurality of third portions 83 of the first element 71 and the plurality of third portions 83 of the second element 72 are connected to one another at their tip parts in a one-to-one relationship.

Specifically, each of the first element 71 and the second element 72 includes a first portion 81, a second portion 82, and a plurality of third portions 83. The plurality of third portions 83 diverge from the second portion 82. Each of the plurality of third portions 83 extends in the first direction X. The plurality of third portions 83 extend substantially in parallel to each other. Currents flow in the plurality of third portions 83 of the first element 71 in substantially the same direction. Similarly, currents flow in the plurality of third portions 83 of the second element 72 in substantially the same direction. The plurality of third portions 83 of the first element 71 and the plurality of third portions 83 of the second element 72 are connected to each other at their tip parts. For that reason, the coupling element 32 of the present modified example includes a plurality of looped shapes. In other words, the first and second elements of the coupling element 32 includes a plurality (e.g., three) slits.

Figure 11:
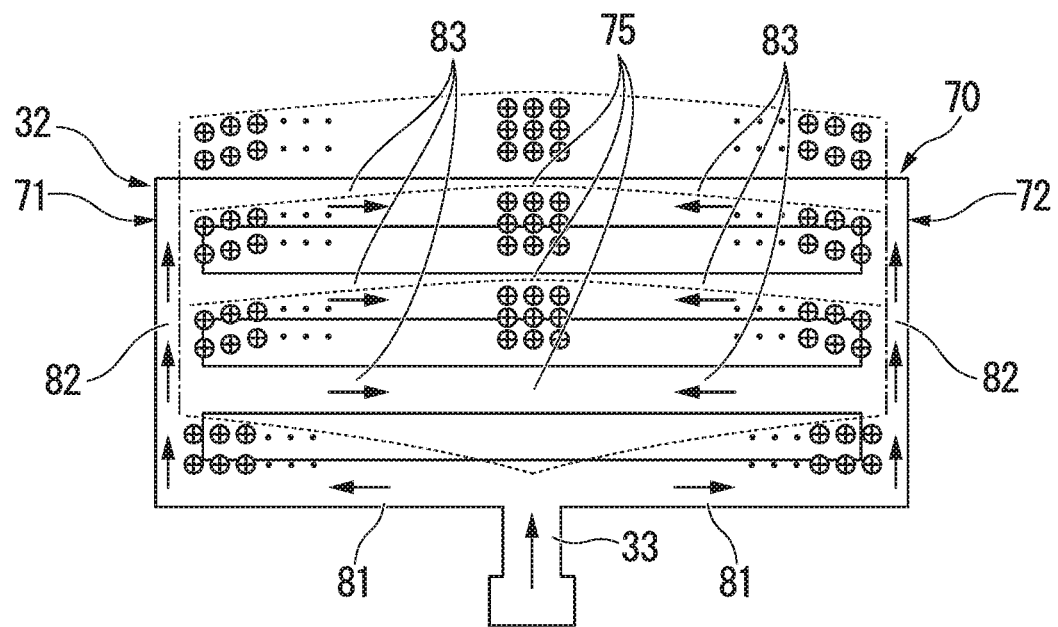
FIG. 11 schematically illustrates an electric charge distribution in a coupler according to the modified example of the second embodiment.

FIG. 11 schematically shows the electric charge distribution of the coupler 11 of the present modified example. Arrows in FIG. 11 show a flow direction of the current in the coupler 11.

As shown in FIG. 11, in the first portion 81 of the first element 71 and the first portion 81 of the second element 72, as in the second embodiment, larger amounts of electric charges are accumulated in portions that are farther from the feeding element 33. Larger amounts of electric charges are accumulated in portions of a plurality of third portions 83 of the first element 71 and a plurality of third portions 83 of the second element 72 that are closer to the connection portion 75 between the first element 71 and the second element 72.

Here, in the present modified example, electric charges accumulated in the plurality of third portions 83 of the first element 71 are electric charges having the same polarity (i.e., all are positive/negative). Therefore, the plurality of third portions 83 of the first element 71 strengthens the electric field with each other. Similarly, the electric charges accumulated in the plurality of third portions 83 of the second element 72 are electric charges having the same polarity (i.e., all are positive/negative). Therefore, the plurality of third portions 83 of the second element 72 strengthens the electric field with each other. As a result, the coupler 11 of the present modified example can further improve the communication performance, as compared with the loop-shaped coupler 11 of the second embodiment.

For example, the length of the second portion 82 is sufficiently smaller than the lengths of the first portion 81 and the third portion 83 and can be substantially ignored. For that reason, in the present modified example, an electrical length L5 between the feed point S1 and the connection portion 75 is, for example, substantially λ/4 in the electric path passing through each of the plurality of third portions 83. In more general terms, in the present modified example, in the electrical path passing through each of the plurality of third portions 83, the electrical length L5 between the feed point S1 and the connection portion 75 is substantially an arbitrary odd number times λ/4. In the plurality of electrical paths corresponding to the plurality of third portions 83, the electrical lengths L5 between the feed point S1 and the connection portion 75 are substantially the same. According to such a configuration, it is possible to further improve the communication performance of the coupler 11.

Third Embodiment

The coupler 11 according to a third embodiment is different from that of the first embodiment in that it is formed in an inverted-F-shape. The configurations other than those described below are the same as those of the first embodiment.

Figure 12:
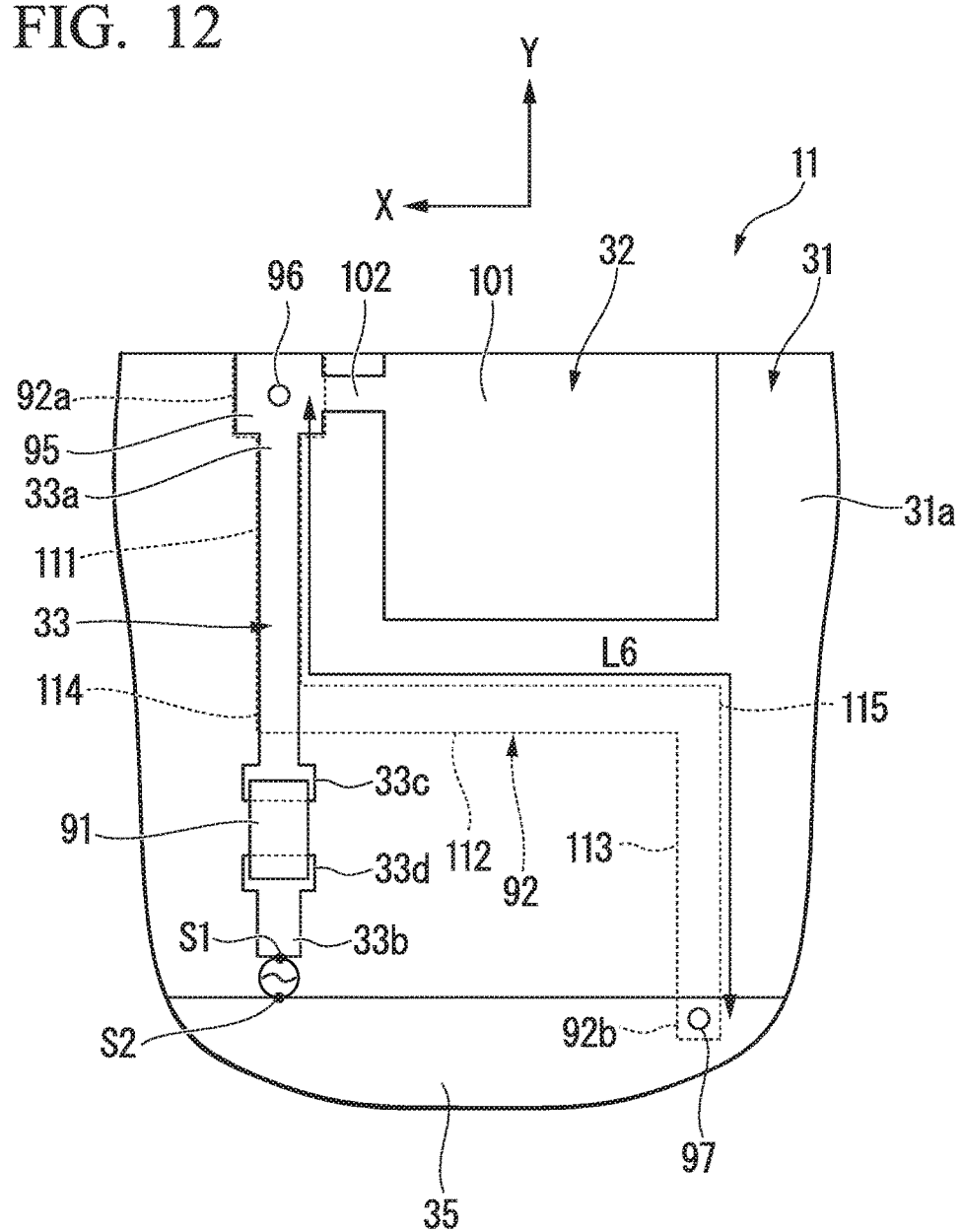
FIG. 12 is a plan view of a coupler according to a third embodiment.

FIG. 12 is a plan view of the coupler 11 according to the third embodiment. As shown in FIG. 12, the coupler 11 of the third embodiment includes the board 31, the coupling element 32, the feeding element 33, a capacitor component 91, a short-circuit element 92, and the ground 35. In the present embodiment, the ground 35 does not include the first ground portion 35a and the second ground portion 35b. Further, in the present embodiment, the first direction X is defined as a direction that intersects with (e.g., substantially orthogonal to) the direction from the ground 35 to the coupling element 32. Also, the second direction Y is defined as a direction from the ground 35 to the coupling element 32.

First, the feeding element 33 and the capacitor component 91 will be described.

The feeding element 33 of the present embodiment linearly extends from the feed point S1 in the second direction Y. The feeding element 33 is, for example, provided on the first surface 31a of the board 31. The feeding element 33 includes the first end 33a connected to one end of the coupling element 32, and the second end 33b connected to the feed point S1. The feeding element 33 includes the first pad 33c and the second pad 33d between the first end 33a and the second end 33b. The first pad 33c and the second pad 33d are disposed apart from each other. No wiring pattern is formed between the first pad 33c and the second pad 33d.

The capacitor component 91 is formed between the feed point S1 and the coupling element 32. The capacitor component 91 is disposed over the first pad 33c and the second pad 33d of the feeding element 33, and electrically connects the first pad 33c and the second pad 33d. That is, the capacitor component 91 electrically coupled to the feed point S1 and the coupling element 32. The capacitor component 91 is, for example, a chip component including a capacitor (i.e., a capacitor element). The capacitor component 91 functions as a capacitor provided in the feeding element 33. The capacitor component 91 is, for example, a capacitor component having a value of 0.1 pF to 0.5 pF. The capacitor component 91 includes a function of bringing about an LC resonance phenomenon to be described below.

The coupling element 32 is disposed only on one side of the feeding element 33 in the first direction X. The coupling element 32 is, for example, disposed on the first surface 31a of the board 31. The coupling element 32 of the present embodiment includes a main body portion 101 and a connection portion 102.

The main body portion 101 is, for example, formed in a rectangular planar shape. As a result, the area of the coupling element 32 to be coupled (i.e., the area of a communication pattern) is enlarged. Further, the shape of the main body portion 101 is not limited to the above example, and the shape of the main body portion 101 may be a circular shape, another polygonal shape, or other shapes.

The connection portion 102 is formed between the main body portion 101 and the feeding element 33. The connection portion 102 is a protrusion which protrudes from the main body portion 101 toward the feeding element 33. The connection portion 102 linearly extends between the main body portion 101 and the feeding element 33 in the first direction X, and electrically connects the main body portion 101 and the feeding element 33. The line width (i.e., the width in the second direction Y) of the connection portion 102 is thinner than the width of the main body portion 101 in the second direction Y.

The short-circuit element 92 is disposed, for example, on the second surface 31b of the board 31. The short-circuit element 92 includes a first end 92a and a second end 92b. The first end 92a of the short-circuit element 92 is connected to a connection portion 95 that is between the feeding element 33 and the coupling element 32. For example, the first end 92a of the short-circuit element 92 is connected to the connection portion 95 through a via 96. Alternatively, the first end 92a of the short-circuit element 92 may be connected to an arbitrary portion of the feeding element 33 between the first end 33a and the second end 33b. On the other hand, the second end 92b of the short-circuit element 92 is connected to the ground 35. For example, the second end 92b of the short-circuit element 92 is connected to the ground 35 through a via 97. That is, the short-circuit element 92 electrically connects the connection portion 95 between the feeding element 33 and the coupling element 32, or the feeding element 33, to the ground 35. As a result, the coupler 11 can perform the proximity wireless communication with high impedance.

In addition, the short-circuit element 92 includes a first portion 111, a second portion 112, a third portion 113, a first bent portion 114, and a second bent portion 115, between the first end 92a and the second end 92b.

The first portion 111 is connected to the first end 92a. The first portion 111 linearly extends from the first end 92a substantially in parallel with the feeding element 33. For example, the first portion 111 extends in the second direction Y. For example, the first portion 111 extends on the back side of the feeding element 33 in the board 31.

The second portion 112 linearly extends from the end of the first portion 111 in a direction different from the extending direction of the first portion 111. For example, the second portion 112 extends in the first direction X. The second portion 112 extends to the same side as the coupling element 32 with respect to the feeding element 33. The second portion 112 extends substantially in parallel with the coupling element 32. A first bent portion 114 of the short-circuit element 92 is formed at a boundary portion (i.e., a connection portion) between the first portion 111 and the second portion 112. The first bent portion 114 is an example of a "non-straight portion." However, the non-straight portion of the short-circuit element 92 is not limited the bent portion. The non-straight portion of the short-circuit element 92 may be a curved portion or another shape portion.

The third portion 113 linearly extends from the end of the second portion 112 in a direction different from the extending direction of the second portion 112. For example, the third portion 113 extends substantially in parallel with the first portion 111. For example, the third portion 113 extends in the second direction Y. The third portion 113 is connected to the second end 92b. A second bent portion 115 of the short-circuit element 92 is formed at a boundary portion (i.e., a connection portion) between the second portion 112 and the third portion 113. The second bent portion 115 is another example of the "non-straight portion."

In the present embodiment, a physical length of the short-circuit element 92 is longer than a physical length of the feeding element 33. Here, the physical length of the short-circuit element 92 is the physical length between the first end 92a and the second end 92b of the short-circuit element 92. The physical length of the feeding element 33 is a physical length between the first end 33a and the second end 33b of the feeding element 33.

In the present embodiment, an electrical length L6 between the first end 92a and the second end 92b of the short-circuit element 92 is substantially $\lambda/4$. Also, in general terms, the electrical length L6 between the first end 92a and the second end 92b of the short-circuit element 92 may be substantially an arbitrary odd number times $\lambda/4$. In the present embodiment, the short-circuit element 92 functions as an inductor. As a result, the LC resonance circuit is formed by the capacitor component 91 and the short-circuit element 92. In other words, the short-circuit element 92 functions as at least a part of the resonator of the coupler 11.

According to such a configuration, since the short-circuit element 92 functions as at least a part of the resonator, the communication performance of the coupler 11 can be improved.

According to at least one embodiment described above, a coupler includes an electromagnetically coupling element and a ground. The ground includes a first ground portion and a second ground portion that are in both sides of the coupling element in a direction intersecting with a direction from the feed point toward the coupling element. According to such a configuration, it is possible to improve the communication performance of the coupler.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A coupler for proximity wireless communication primarily based on an electric induction field generated therein, comprising:

a substrate;
a ground layer formed on a first region of the substrate and surrounding a second region of the substrate on three sides of the second region, a fourth side of the second region being defined by an edge of the substrate; and
a coupling element electrically isolated from the ground layer and formed on the second region of the substrate, wherein
the coupling element includes a first portion that extends adjacent to and along the edge of the substrate and a second portion that is electrically connected to the first portion, extends inwardly from the edge of the substrate, and includes an inductor.

2. The coupler according to claim 1, wherein opposing sides of the second region are defined by two edges of the ground layer which extend inwardly from the edge of the substrate parallel to the second portion of the coupling element.

3. The coupler according to claim 2, wherein
the coupling element is formed in a symmetrical shape with respect to a line that extends parallel to the two edges of the ground layer and through a center of the second region.

4. The coupler according to claim 2, wherein
a gap between an end of the first portion of the coupling element and one of the two edges of the ground layer is smaller than a length of the second portion of the coupling element.

5. The coupler according to claim 1, wherein
the second portion of the coupling element extends inwardly from a center region of the first portion.

6. The coupler according to claim 1, wherein
the second portion of the coupling element extends inwardly from the edge of the substrate, and
the coupling element further includes a third portion that connects the first portion and the second portion.

7. The coupler according to claim 1, wherein
the first portion of the coupling element includes one or more slits extending in a direction parallel to the edge of the substrate.

8. The coupler according to claim 1, further comprising:
a high pass filter formed on the second region of the surface of the substrate, such that the second portion is between the first portion and the high pass filter.

9. The coupler according to claim 1, wherein
a physical length of a section of the coupling element that extends along the first portion from an end of the first portion that faces one of the two edges of the ground layer to the second portion and then along the second portion from the first portion to an inward end of the second portion is shorter than $n \times \lambda/4$, and
an electrical length of the section of the coupling element is greater than the physical length and substantially equal to $n \times \lambda/4$, where n is an odd number and $\lambda$ is a wavelength of a center frequency of electromagnetic waves transmittable or receivable by the coupling element.

10. A coupler for proximity wireless communication primarily based on an electric induction field generated therein, comprising:
a substrate;
a ground layer formed on a first region of the substrate and surrounding a second region of the substrate on three sides of the second region, a fourth side of the second region being defined by an edge of the substrate; and a coupling element electrically isolated from the ground layer and formed on the second region of the substrate, wherein the coupling element includes a first portion that extends adjacent to and along the edge of the substrate and a second portion that is electrically connected to the first portion, extends inwardly from the edge of the substrate, and includes an inductor, and the first portion of the coupling element includes one or more slits extending in a direction parallel to the edge of the substrate.

11. The coupler according to claim 10, wherein the coupling element is formed in a symmetrical shape with respect to a line that extends parallel to the two edges of the ground layer and through a center of the second region.

12. The coupler according to claim 10, wherein the second portion of the coupling element extends inwardly from a center region of the first portion thereof.

13. The coupler according to claim 10, further comprising:

a high pass filter formed on the second region of the surface of the substrate, such that the second portion is between the first portion and the high pass filter.

14. The coupler according to claim 10, wherein a physical length of a section of the coupling element that extends along the first portion from an end of the first portion that faces one of the two edges of the ground layer to the second portion and then along the second portion from the first portion to an inward end of the second portion is shorter than $n \times \lambda/4$, and an electrical length of the section of the coupling element is greater than the physical length and substantially equal to $n \times \lambda/4$, where n is an odd number and $\lambda$ is a wavelength of a center frequency of electromagnetic waves transmittable or receivable by the coupling element.

15. An electronic device comprising:

a coupler for proximity wireless communication primarily based on an electric induction field generated therein; and a wireless communication module configured to generate a signal to be transmitted through the coupler, wherein the coupler includes:

a substrate;

a ground layer formed on a first region of the substrate and surrounding a second region of the substrate on three sides of the second region, a fourth side of the second region being defined by an edge of the substrate; and a coupling element electrically isolated from the ground layer and formed on the second region of the substrate, the coupling element including a first portion that extends adjacent to and along the edge of the substrate and a second portion that is electrically connected to the first portion, extends inwardly from the edge of the substrate, and includes an inductor, wherein a physical length of a section of the coupling element that extends along the first portion from an end of the first portion that faces one of the two edges of the ground layer to the second portion and then along the second portion from the first portion to an inward end of the second portion is shorter than $n \times \lambda/4$, and an electrical length of the section of the coupling element is greater than the physical length and substantially equal to $n \times \lambda/4$, where n is an odd number and $\lambda$ is a wavelength of a center frequency of electromagnetic waves transmittable or receivable by the coupling element.

16. The electronic device according to claim 15, wherein the coupling element is formed in a symmetrical shape with respect to a line that extends parallel to the two edges of the ground layer and through a center of the second region.

17. The electronic device according to claim 15, wherein a gap between an end of the first portion of the coupling element and one of the two edges of the ground layer is smaller than a length of the second portion of the coupling element.

18. The electronic device according to claim 15, wherein the second portion of the coupling element extends inwardly from a center region of the first portion thereof.

19. The electronic device according to claim 15, wherein the first portion of the coupling element includes one or more slits extending in a direction parallel to the edge of the substrate.

20. The electronic device according to claim 15, wherein the coupler further includes a high pass filter formed on the second region of the surface of the substrate, such that the second portion is between the first portion and the high pass filter.

* * * * *